United States Patent [19]

Fox

[11] Patent Number: 4,553,088
[45] Date of Patent: Nov. 12, 1985

[54] WIRING PAIR REVERSAL DETECTOR

[75] Inventor: Kenneth R. Fox, Berwyn, Ill.

[73] Assignee: GTE Automatic Electric Incorporated, Northlake, Ill.

[21] Appl. No.: 562,645

[22] Filed: Dec. 19, 1983

[51] Int. Cl.[4] .......................................... G01R 19/00
[52] U.S. Cl. .................................................... 324/66
[58] Field of Search .................. 324/66, 73 PC, 73 R, 324/51; 339/276 A

[56] References Cited

U.S. PATENT DOCUMENTS 4,091,325  5/1978  Marcus et al. ..................... 324/66 X

FOREIGN PATENT DOCUMENTS 1173465  12/1969  United Kingdom ........... 339/276 A
2022853  12/1979  United Kingdom ................... 324/66
2058363   4/1981  United Kingdom ................... 324/66

Primary Examiner—Stanley T. Krawczewicz
Attorney, Agent, or Firm—Charles A. Doktycz

[57] ABSTRACT

An alarm apparatus for use with a numerically controlled twisted pair wire wrap wiring machine that indicates to the operator the position and the wire of a pair that is to be wired. The apparatus is connected to the indicator lights of the machine and to the wiring gun to sense the gun placement on the pin. The proper conditions are logically combined, should a condition be changed as by placing a signal wire on a grounded pin an alarm is sounded.

8 Claims, 1 Drawing Figure

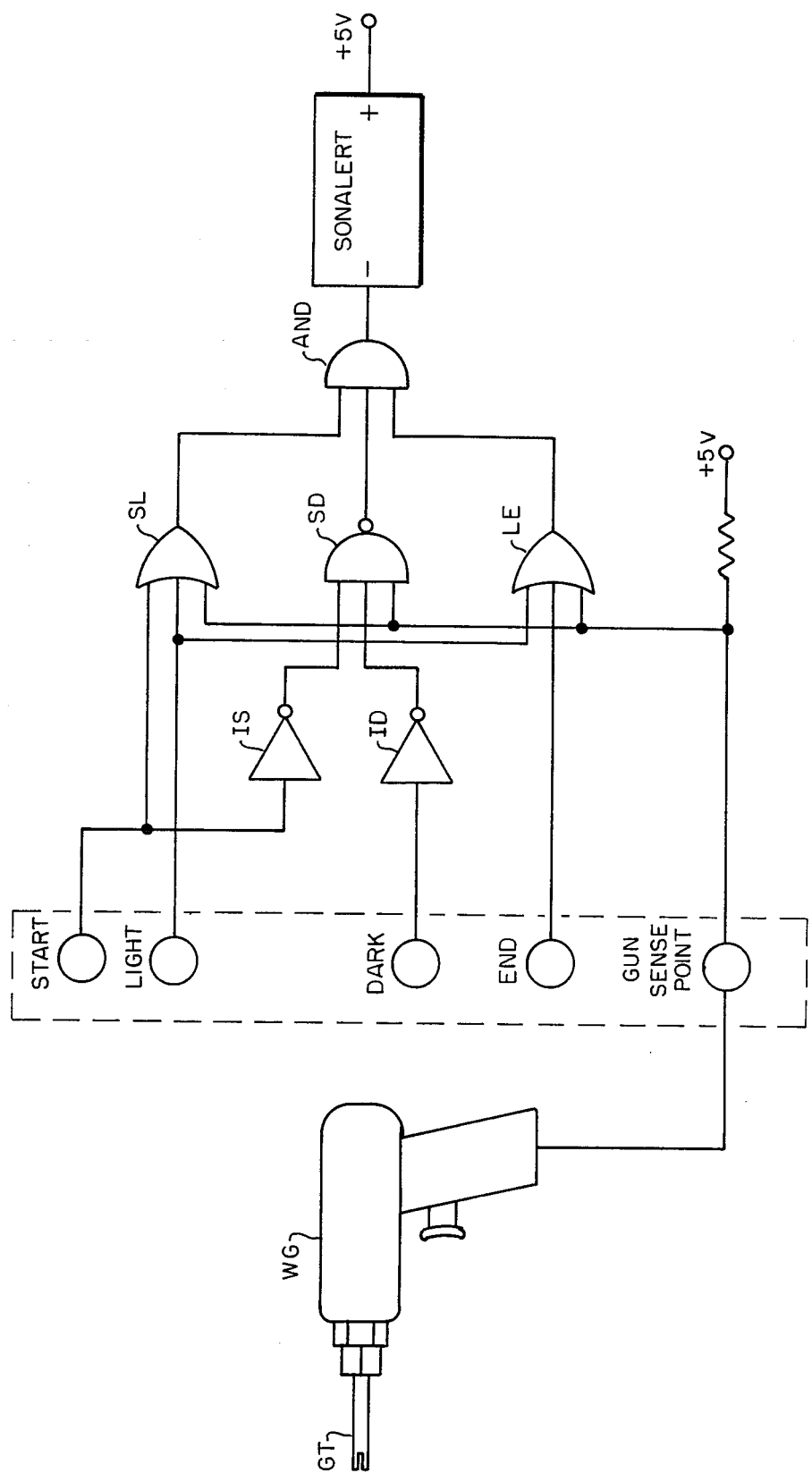

WIRING PAIR REVERSAL DETECTOR

FIELD OF THE INVENTION

This invention relates to electronic assembly and wiring operations and, more particularly, to an arrangement for alerting an operator of a wiring machine of an improper connection.

BACKGROUND OF THE INVENTION

In the manufacture of large electronic systems it is common practice to have the individual subassemblies on printed circuit cards which are plugged into jacks that are wired to interconnect the cards into a functional system. The wiring that interconnects the various jacks into which the printed circuit cards are plugged into also includes some printed circuitry, but do not include the signal connections between the card jacks. Much of this latter type of wiring is done on machinery which indicates to an operator where a wire is to be placed initially and where it is to be terminated. A machine of this type is one manufactured by the Computer Numerical Control Corporation and designated Model No. 1000-SSS. This is a semi-automatic machine that is programmed to indicate to the operator where a wire is to be placed and in the case of paired wiring whether the prime wire, the dark wire, or the mate, the lighter wire, is to be placed on a particular terminal.

While performing such wiring assignment terminations, possible cross wiring may occur. This is frequently due to human error in placing for example a blue or black wire of a twisted pair of wires into the wiring gun without proper sequencing. Heretofore, there has been no way of determining if the wires were indeed terminated properly. If the wires were cross-connected, the net that the wires were in would be a broken net, and both functions of the net would be grounded, since the wiring terminals for the mating wire are grounded. In frame testing, these problems are difficult to detect and time consuming to repair.

SUMMARY OF THE INVENTION

Accordingly, it is an object of the present invention to provide an apparatus that will provide an indication to the wiring machine operator of a wiring reversal error.

The invention is wired to the wire wrap gun, to the sequencing lights of the numerical control wiring machine and to the backplane ground to logically combine these signals to sound an alarm upon detecting an erroneous combination.

This twisted pair wiring reversal detector provides an inexpensive method of verifying that the signal lead is not grounded, and that the ground lead is indeed grounded. This is ideally accomplished at the time that the paired wiring operation is being performed. At this point if an error is detected, it can easily be remedied, without additional wires being overlayed on the cross-wired pair. Thus facilitating easy repair of the miswired pair. It is normally silent and does not distract an operator except when an error is detected at which time an audible alarm to alert the operator of a reversal condition is sounded. The verification of the integrity of both the signal lead being open, and the ground lead being grounded is thereby ensured.

BRIEF DESCRIPTION OF THE DRAWING

Additional features and advantages of the apparatus in accordance with the present invention will be better understood by reference to the following description of a preferred embodiment of the invention, taken in conjunction with the accompanying schematic drawing.

DESCRIPTION OF THE PREFERRED EMBODIMENT

A typical cycle of the wiring machine is to position the wiring gun indicator at a particular backplane wiring terminal pin after which operation the "start" light and the "light" light are lit. The operator has then to take a pre-cut pair of wires, insert one pre-stripped end of the light colored wire, say for example blue of a blue black pair, into the gun tip GT and spin it onto the indicated terminal. Upon completion of this operation, an advance switch is activated to advance the numerical controlled machine to the next step. The machine then advances and positions the wiring gun indicator at the next terminal to be wired and activates the "start" and "dark" indicator lights.

The operator is now to take the second wire of the pair the darker or black wire of a blue-black pair at the same end and insert the pre-stripped end into the gun tip and spin it onto the indicated terminal. Upon completion, the advance switch is actuated and the numerical control machine advances the gun indicator to the next wiring pin position, and activates the "end" and "light" indicator lights.

The operator is now to proceed to dress the wires and take the free end of the light wire, the blue wire in this example, and wire it onto the indicated terminal and again activate the advance switch. The machine again advances this indicator to the wiring position for the remaining wire and activates the "end" and "dark" indicator lights. The operator has now to insert the stripped end of the remaining dark wire into the tip GT of the gun WG and spin it onto the indicated terminal after which operation upon activation of the advance switch the machine will advance to the wiring position for the next pair of wires and the cycle will be repeated.

As can be seen from the drawing there is a negative or electronic "low" potential available from the indicator lights when they are turned on.

The isolated wire wrap gun WG has a single conductor stranded wire attached to it. This wire is run alongside the air line powering the gun. The other end of the wire is attached to a pullup resistor, thereby biasing the gun to an electronic "high" potential. By the term "high" it is meant a positive three to five volts D.C., which is current limited via a pullup resistor. This gun sense point (GSP) potential is used and logically combined with the two other signals that are present for each wiring position.

These other signals being obtained from the wiring machine signals that operate the indicator panel lights. Normally these signals are at a logic high or "1" until the time that the lights are lit, at which time the signal lead goes to a logic low or "0" potential.

For each of the four operations of a wired pair wiring cycle there are present the following signals in addition to that of the gun sense point.

Start and Light
Start and Dark

| | |
|---|---|
| End and Light | |
| End and Dark | Not used since this error is not possible if the previous three conditions are correct. |

Thus, by logically combining these signals for the first wire placement position there are present at the "OR" gate SL input the following signals: start at "0", light at "0" and the gun sense point should not be grounded and therefore have a "1" input to result in a "1" output to keep the gate AND output at a logic "1" or +5 volts and the alarm silent. Gates SD and LE both have logic 1 outputs at this time. Should the wiring operator place the wire on a grounded pin at this time the inputs at gate SL would then be three lows and the output would be a low to cause the gate AND to output a low and thus activate the audible alarm. Similarly for the second step of the wiring, the start and dark signals are at a logic low, however both signals are inverted at inverters IS and ID at the input of the NAND gate SD thus having inputs of logic $1+1+0$ resulting in a logic "1" output to keep the gate AND with a +5 volt output. The operations for the other ends of the wire pair at steps End and Light and End and Dark result in the same outputs.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. Alarm apparatus for use with a numerical control wire wrap gun wiring machine that mechanically indicates the position for a wire placement and visually indicates by indicator lights the first or second end and light or dark wire of a pair of wires that is to be wired onto the indicated terminal comprising:
   a gun sense point terminal on said wire wrap gun;
   audible alarm means;
   a first gate means having an output and including a first input from said first indicator light means, a second input from said light indicator light means and a third input from said wire wrap gun sense point;
   means connecting said first gate output to said audible alarm means;
   said inputs from said indicator lights normally having a logic high level except when operated when they have a logic low level signal;
   said wire wrap gun sense point normally biased to a logic high level;
   said first gate means operated to activate said audible alarm means upon said gun sense point placing a wire on a grounded terminal.

2. Alarm apparatus as claimed in claim 1, wherein said first gate means remains unoperated upon said gun sense point placing a wire on an open terminal.

3. Alarm apparatus as claimed in claim 1, wherein said first gate means is an OR gate.

4. Alarm apparatus as claimed in claim 1 further including:
   a second three input gate means having an output connected to said audible alarm means;
   first and second signal inverter means;
   a first input connected via said first inverter means from said first light indicator means;
   a second input connected via said second signal inverter means from said dark indicator light means and said third input connected to said wire wrap gun sense point; and
   said second gate means operated to activate said audible alarm means upon said gun sense point failing to place a wire on a grounded terminal.

5. Alarm apparatus as claimed in claim 4, wherein said second gate means is a NAND gate.

6. Alarm apparatus as claimed in claim 4 further including:
   a third three input gate means having an output connected to said audible alarm means;
   a first input connected from said second light indicator means;
   a second input connected from said light indicator light means and said third input connected to said wire wrap gun sense point; and
   said third gate means operated to activate said audible alarm means upon said gun sense point placing a wire on a grounded terminal.

7. Alarm apparatus as claimed in claim 6, wherein said third gate means is an OR gate.

8. Alarm apparatus as claimed in claim 6, wherein said audible alarm means includes a three input AND gate to which said first, second and third gate means outputs are connected.

* * * * *